United States Patent [19]

Bartholomew et al.

[11] Patent Number: 4,885,662
[45] Date of Patent: Dec. 5, 1989

[54] CIRCUIT MODULE CONNECTION SYSTEM

[75] Inventors: Wesley E. Bartholomew, Layton, Utah; Michael C. Tolle, Los Angeles, Calif.

[73] Assignee: Leonard A. Alkov, Del.

[21] Appl. No.: 231,424

[22] Filed: Aug. 12, 1988

[51] Int. Cl.⁴ .......................... H05K 7/20; H01R 9/00
[52] U.S. Cl. ...................... 361/386; 165/80.3; 165/185; 357/81; 361/388; 361/406; 361/408; 361/413
[58] Field of Search ............... 361/386–389, 361/394, 395, 400, 403–406, 408, 413, 414; 357/81; 165/80.3, 185

[56] References Cited

U.S. PATENT DOCUMENTS

| | | | |
|---|---|---|---|
| 3,541,222 | 11/1970 | Parks et al. | 361/419 |
| 3,616,532 | 11/1971 | Beck | 361/408 |
| 4,050,756 | 9/1977 | Moore | 361/413 |
| 4,581,679 | 4/1986 | Smolley | 361/393 |
| 4,597,029 | 6/1986 | Kucharek et al. | 361/408 |

OTHER PUBLICATIONS

Markewycz, "Distribution System For Multilayer Ceramic Modules", IBM Technical Disclosure Bulletin, vol. 19, No. 4, pp. 1270–1271.
Gagnon et al, "Plating Through-Holes", IBM Technical Disclosure Bulletin, vol. 11, No. 12, pp. 1704–1705.

Primary Examiner—Gregory D. Thompson
Attorney, Agent, or Firm—Leonard A. Alkov; Wanda Denson-Low

[57] ABSTRACT

Circuit module connection system for connection of a modular package (18) to a printed wiring board (12) has a contact (24) on the package and an aligned pad (16) on the board. A resilient contact (44) is positioned therebetween and is held in place and separated from adjacent contacts by means of contact retainer (34). The contact retainer (34) also has a seal flange (40) to resiliently seal out the environment. A thermal member (42) spaces the package from the board and permits heat flow out of the package.

11 Claims, 2 Drawing Sheets 4,885,662

CIRCUIT MODULE CONNECTION SYSTEM

FIELD OF THE INVENTION

This invention is directed to a connection system for electrically and thermally interconnecting a package having electrical components therein with a printed wiring board upon which it is mounted.

BACKGROUND OF THE INVENTION

Circuit modules or packages in present electrical arts contain various active electrical components, such as integrated circuits, transistors, and sometimes passive electrical components such as resistive, capacitive or inductive components. They are conventionally adhesively secured onto a printed wiring board with an organic adhesive, such as a polysulfide bond. Such adhesive materials are difficult to use and are poor thermal conductors. Such modules or packages are electrically connected to the printed wiring board by means of solder connection of peripheral leads on the package onto pads on the printed wiring board. If the package needs to be removed, all solder joints must be melted down and the leads separated from the printed wiring board. This process often damages the printed wiring board through excessive heat and often damages the package through bending of the leads. From an electrical viewpoint, the lead from the package to the printed wiring board is long and may not satisfy the response needs of very high-speed integrated circuits which require a close-coupled, high-speed signal circuit.

SUMMARY OF THE INVENTION

In order to aid in the understanding of this invention, it can be stated in essentially summary form that it is directed to a circuit module connection system wherein a resilient metallic electrical and thermal conductor is retained in place between a contact on a printed wiring board and a contact on a circuit module or package, with the retention including an electrically insulating elastomer which seals the space between the circuit module and the printed wiring board.

It is thus a purpose and advantage of this invention to provide a circuit module connection system in which a resilient electrical conductor is positioned between a contact pad on a circuit module and a contact pad on a printed wiring board so that detachable electrical connection can be made between the circuit module and the printed wiring board.

It is another purpose and advantage of this invention to provide a system wherein detachable connection is made between a module and a pad on a printed wiring board by the positioning of a conductor therebetween and retaining the conductor in position by locating it by means of an elastomer positioned between the module and the board so that accurate alignment is achieved.

Other purposes and advantages of this invention will become apparent from a study of the following portion of this specification, the claims and the attached drawings.

DESCRIPTION OF THE PREFERRED EMBODIMENTS

Figure 1:
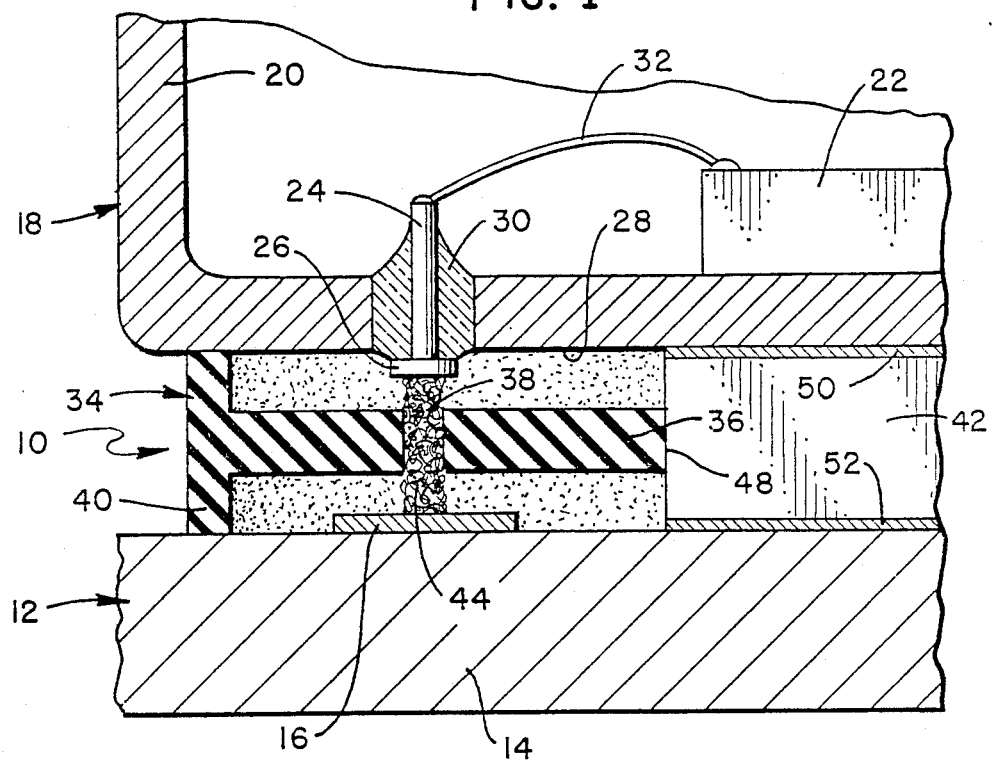
FIG. 1 is a vertical section through a first preferred embodiment of the connection system of this invention.

The first preferred embodiment of the connector system of this invention is generally indicated at 10 in FIG. 1. Printed wiring board 12 includes a substrate 14 which is usually of fiber-reinforced organic polymer material so that the substrate is electrically insulative. Pad 16 is formed on the top surface of the substrate and is interconnected as required to define a conventional printed wiring board. The printed wiring board 12 may have a plurality of conductive traces on intermediate layers, with appropriate locations of the traces connected to each other through vias. The module or package to be mounted on and electrically connected to the printed wiring board 12 is generally indicated at 18. The modular package includes case 20, which has a cavity so as to be able to contain electrical components. These components include microcircuit 22, which microcircuit may be an integrated circuit chip or it may be semiconductor elements together with other circuit elements. Furthermore, other circuit elements may be located within case 20 and electrically connected therein. The case 20 may be a Kovar case with a suitable cover and/or potting of the case contents.

In order to permit electrical connection to the hybrid circuit within the case, a plurality of contacts extend through the case wall. Contact pin 24 has a contact head 26 which is positioned generally level with or extending slightly below the bottom surface 28 of the bottom wall of the microcircuit case. The contact pin is held in place and insulated from the case by means of nonconductive (glass, for example) insulator 30 which bonds both to the case and the contact pin. In this way, electric contact can be made to the contents of the hermetically sealed case. Wire 32 connects the contact pin to the microcircuitry. It is understood that there is a plurality of such contact pins mounted on the case and permitting electrical contact to the circuitry within the case.

Figure 4:
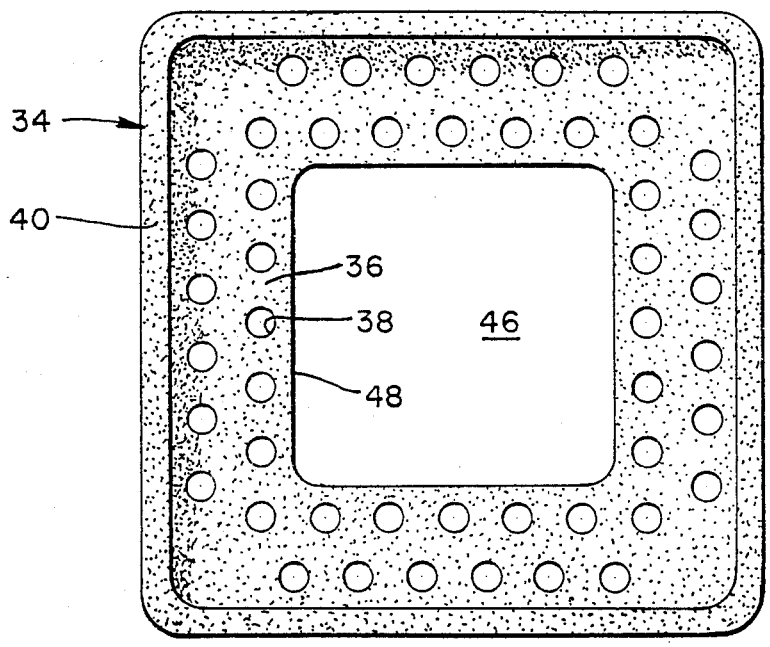
FIG. 4 is a plan view of the conductor retainer of the nature used in all three embodiments.

Contact retainer 34 is seen in FIGS. 1 and 4. Contact retainer 34 is shown as being square in FIG. 4 so that it is suitable for a square case. Should the case be rectangular or other shape, the plan view appearance of the contact retainer would correspond. Contact retainer 34 comprises a web 36 of elastomeric material having a plurality of openings therein. One of the openings is indicated at 38 in FIGS. 1 and 4. Around the outer periphery of the web is flange 40. The flange 40 is integrally formed with the web, and the contact retainer is formed of a resilient elastomeric dielectric material. As is seen in FIG. 1, the bottom of the modular package 18 is spaced above the top of printed wiring board 12. The amount of the spacing is established by member 42, described in more detail hereinafter, which occupies the space therebetween. The height of flange 40 is such that it resiliently deflects upon engagement between the printed wiring board and the module package in order to seal the space surrounded by flange 40.

Opening 38 in web 36 is in alignment between contact pad 16 on the printed wiring board and the head of contact pin 24. Contact 44 is positioned in the opening 36 and extends above and below web 36, as shown in FIG. 1. Contact 44 is a compliant conductive contact, and is preferably a metallic material which is resilient and resistant to oxidation or other reduction in low contact properties. Suitable materials include hard gold alloys, beryllium copper, hard copper alloys, and electrically conductive synthetic polymers. A hard brass wool is a suitable contact, but a gold-plated hard brass wool would be more favorable in environments where maximum reliability and minimum contact resistance over time are desired. Similarly, a metallic coil spring would be suitable. The undeflected height of the contact 44 is greater than the distance between head 26 and pad 16 so that when assembled, the resilient contact material is deflected and thence maintains contact pressure.

As is best seen in FIG. 4, there is an interior opening 46 in the interior of web 36, defined by interior flange edge 48. As is seen in FIG. 1, member 42 is sized to fit within the opening 46. Member 42 is a metal thermal conductor in engagement both with the bottom of the module package and with the printed wiring board. Thin layers 50 and 52 of thermal grease are shown to illustrate the completion of the thermal path from the modular package to the printed wiring board. In such a case, the modular package is clamped in place so as to permit the modular package to be located and secured without the need for soldering of leads or the adhesive attachment of the package. This clamping on of the package together with the resilient contacts permits the modular package to be easily and reliably electrically connected to and secured to the printed wiring board and readily removed therefrom, all without soldering of leads and adhesive attachment. The thermal conductor between the package and the printed wiring board provides a highly efficient thermal path to permit the heat to pass to the printed wiring board. This thermal path is a considerable improvement over the polysulfide bonding material often presently used to secure the package to the printed wiring board and provide a thermal path. Furthermore, the absence of the adhesive is part of the ease of replacement. In addition, the short, direct electrical path length provides excellent electrical performance of the modular package to printed wiring board connection. The excellent impedance control is achieved by means of the elastomeric dielectric contact retainer maintaining the contacts separate.

Figure 2:
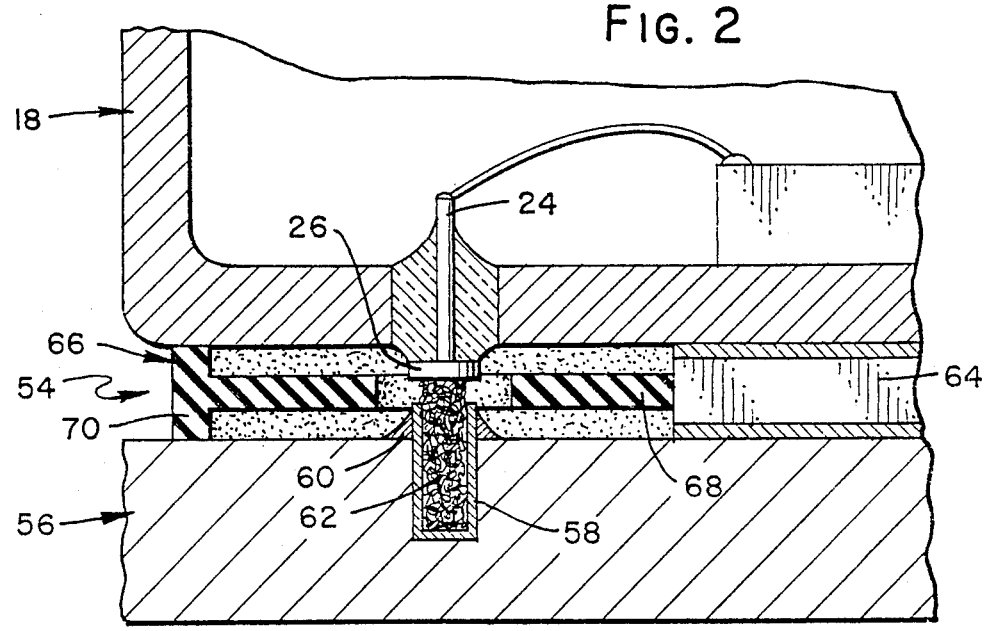
FIG. 2 is a similar section through a second preferred embodiment thereof.

FIG. 1 shows the contact 44 positioned between the bottom of the modular package and the top of the printed wiring board. By recessing the resilient contact into the printed wiring board, the height can be reduced. FIG. 2 shows connection system 54 which connects the same modular package 18 to printed wiring board 56. Printed wiring board 56 is a conventional dielectric single or multiple layer printed wiring board with circuit traces at one or more levels, as described above. Contact must be made to the circuit traces from the plurality of contact pins on the bottom of modular package 18. Socket 58 is a metal cup recessed into printed wiring board 56, as by being set in a hole therein and soldered by means of solder fillet 60 to a trace on the top surface of board 56. It is preferable to solder the socket in place with a contact to a wiring trace on the top surface because of convenience, but the socket could be electrically connected to one or more of the traces on intermediate layers of the printed wiring board. Contact 62 is placed in socket 58 and extends thereabove into resilient contact with the head 26 of the contact pin. The contact 62 is of the same material as described above, that is a resilient conductor, for example brass spring or wool. The contact is sized to resiliently deflect when the modular package is brought into position as shown. There is a plurality of such contacts, corresponding in number and position to the active contacts on the package.

Thermal member 64, with its thermal grease layers, defines the distance between the bottom of the modular package and the top of printed wiring board 56, to thus define the distance between head 26 and cup 58 to thus define the compression of contact 62. The modular package is clamped into place on the printed wiring board.

In this case, retainer 66 with its web 68 and flange 70 are not strictly necessary to hold contact 62 in place, but the contact retainer is helpful in providing the seal around the contact area. Again, a plurality of contacts 62, contact pins and contact sockets are provided, in alignment with each other to provide the necessary and desirable electrical connection. The retainer maintains the separation of the contacts. The plan view of the contact retainer 34 shown in FIG. 4 also defines the plan configuration of contact retainer 66. In this configuration the spacer member 64 is thinner than the spacer 42 to result in improved thermal conductivity.

Figure 3:
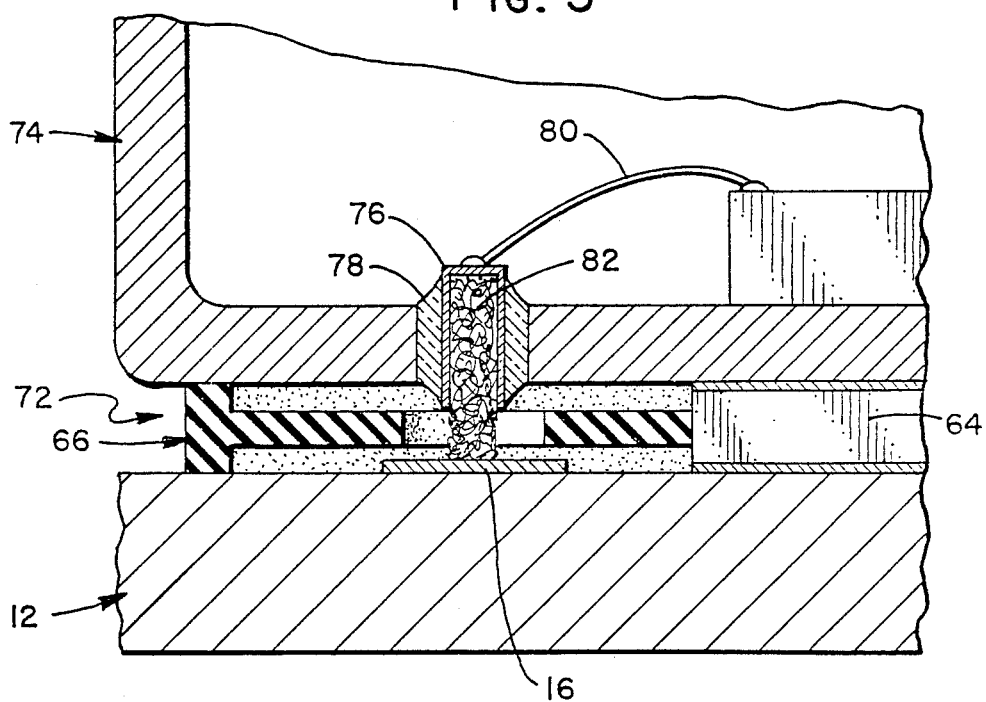
FIG. 3 is a vertical section through a third preferred embodiment thereof.

FIG. 3 shows a connection system 72 wherein the contact is recessed in the bottom of the modular package to thus conserve height, with the same weight conservation as illustrated in FIG. 2. In the connection system 72, the printed wiring board is the same as printed wiring board 12 and carries a plurality of contact pads, one of which is contact pad 16. The thermal member in this system is the same as thermal member 64 with its thermal grease layers, and the contact retainer 66 is the same as the one shown in FIG. 2. Modular package 74 has the same case, internal components and circuitry as the modular package 18. To achieve contact from the internal electrical circuits to the exterior of the modular package, contact cup 76 extends through an opening in the bottom of the package and is sealed therein and is insulated therefrom by means of glass 78. Connector wire 80 is connected to the cup and to the circuitry within the package. The cup is electrically conductive and is made of brass or the like. Contact 82 is the same as contact 62 and is a resilient electrically conductive contact, as described above. It is understood that there is a plurality of such contacts, as indicated by the openings in the web in FIG. 4, with these contacts being positioned so as to achieve the desired connections. The contact retainer 66 in FIG. 3 acts as a seal to protect the area of the contact 82 and to maintain separate the adjacent contacts.

Each of the connection systems 10, 54 and 72 can be employed with Kovar or ceramic package hybrid circuits, and such connections are superior for very high-speed integrated circuitry because the contacts are much shorter than the long peripheral leads conventionally found on packaged hybrid circuits. Attachment and removal is quick, reliable and easy so that repairs can be achieved without damage to the associated parts.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A circuit module connection system for detachably attaching a modular package case having a contact thereon to a printed wiring board having a pad thereon in alignment with the contact on the package case, comprising:
  a plurality of separate resilient electrically conductive contacts each for positioning between a pad on a board and a contact on a module, said resilient electrically conductive contacts being selected from the group consisting of brass, hard brass wool, gold alloys, copper alloys and electrically conductive synthetic polymers;
  retainer means surrounding each said resilient contact to constrain each said resilient contact and separate said resilient contacts from each other; and
  wherein said retainer means is an elastomeric retaining means having an opening therethrough for each said resilient contact and having a flange thereon for engagement with both the module and the printed wiring board.

2. A circuit module connection system comprising:
  a modular package case having electronic circuitry therein and having a bottom wall and a plurality of electric contacts extending from said bottom wall of said case in electric contact with the circuitry in said modular package case;
  a printed wiring board having a plurality of pads thereon corresponding in position to said contacts on said modular package case;
  a contact retainer between said case and said printed wiring board, said contact retainer being made of dielectric material and having an opening therethrough in alignment with each said contact and pad, said contact retainer being in contact with both said printed wiring board and said modular package case to seal the space around said contacts
  a thermal member in thermal contact with both said modular package case and said printed wiring board, said thermal member being positioned within an opening in said contact retainer; and
  a resilient electric contact in each of said openings in said retainer, each said contact being resiliently engaged with one of said contacts on said case and with one of said pads on said printed wiring board, each said resilient contact being formed of electrically conductive material to provide detachable electric connection between one of said pads and one of said contacts, said retainer separating said resilient contacts from each other to provide electrical separation therebetween.

3. A circuit module connection system comprising:
  a modular package case having electronic circuitry therein and having a bottom wall and a plurality of electric contacts extending from said bottom wall of said case in electric contact with circuitry in said modular package case;
  a printed wiring board having a plurality of pads thereon corresponding in position to said contacts on said modular package case;
  a retainer between said case and said printed wiring board, said retainer being made of dielectric material and having an opening therethrough in alignment with each said contact and pad; and
  a resilient electric contact in each of said openings in said retainer, each said contact being resiliently engaged with one of said contacts on said case and with one of said pads on said printed wiring board, each said resilient contact being formed of electrically conductive material to provide a detachable electrical connection between one of said pads and one of said contacts, each said opening in said contact retainer being defined by walls which respectively engage on a respective resilient contact in each opening to retain the respective resilient contact in the respective opening.

4. The circuit module connection system of claim 3 wherein said contact retainer is in contact with both said printed wiring board and said modular package case to seal the space around said resilient contacts.

5. The circuit module connection system of claim 4 further including a thermal member in thermal contact with both said modular package case and said printed wiring board, said thermal member being positioned within an opening in said contact retainer.

6. A circuit module connection system comprising:
  a modular package case having electronic circuitry therein and having a bottom wall and a plurality of electric contacts extended from said bottom wall of said case in electric contact with circuitry in said modular package case;
  a printed wiring board, a plurality of sockets on said printed wiring board each mounted in a recess in said printed wiring board for electrical connection with traces on said printed wiring board;
  a retainer between said case and said printed wiring board, said retainer being made of dielectric material and having an opening therethrough in alignment with each said contact and socket; and
  a resilient contact being positioned within each said socket and extending therefrom into contact with one of said contacts on said modular package case, each said resilient contact being formed of an electrically conductive material to provide a detachable electrical connection between one of said pads and one of said contacts, said retainer separating said resilient contacts from each other to provide electrical separation therebetween.

7. The circuit module connection system of claim 6 wherein said contact retainer is in contact with both said printed wiring board and said modular package case to seal the space around said resilient contacts.

8. The circuit module connection system of claim 7 further including a thermal member in thermal contact with both said modular package case and said printed wiring board, said thermal member being positioned within an opening in said contact retainer.

9. A circuit module connection system comprising:
  a modular package case having electronic circuitry therein and having a bottom wall and a plurality of electric contacts extending form said bottom wall of said case in electric contact with the circuitry in said modular package case, a plurality of said contacts on said modular package case comprising an electrically conductive socket in said modular package case;
  a printed wiring board having a plurality of pads thereon corresponding in position to said contacts on said modular package case;
  a retainer between said modular package case and said printed wiring board, said retainer being made of dielectric material and having an opening therethrough in alignment with each said contact and pad; and
  a resilient electric contact in each one of said socket and extending therefrom into contact with said pads on said printed wiring board, each said resilient contact being formed of electrically conductive material to provide a detachable electrical connection between one of said pads and one of said contacts, said retainer separating said resilient contacts from each other to provide electrical separation therebetween.

10. The circuit module connection system of claim 9 wherein said contact retainer is in contact with both said printed wiring board and said modular package case to seal the space around said resilient contacts.

11. The circuit module connection system of claim 10 further including a thermal member in thermal contact with both said modular package case and said printed wiring board, said thermal member being positioned within an opening in said contact retainer.

* * * * *